US009146157B1

(12) United States Patent
Rajavel et al.

(10) Patent No.: US 9,146,157 B1
(45) Date of Patent: Sep. 29, 2015

(54) DUAL BAND SWIR/MWIR AND MWIR1/MWIR2 INFRARED DETECTORS

(75) Inventors: Rajesh Rajavel, Oak Park, CA (US); Hasan Sharifi, Agoura Hills, CA (US); Terence De Lyon, Newbury Park, CA (US); Brett Nosho, Santa Monica, CA (US); Daniel Yap, Newbury Park, CA (US)

(73) Assignee: HRL Laboratories, LLC, Malibu, CA (US)

( * ) Notice: Subject to any disclaimer, the term of this patent is extended or adjusted under 35 U.S.C. 154(b) by 532 days.

(21) Appl. No.: 13/427,387

(22) Filed: Mar. 22, 2012

(51) Int. Cl.
*G01J 5/20* (2006.01)
*G01J 3/36* (2006.01)
*H01L 27/146* (2006.01)

(52) U.S. Cl.
CPC .............. *G01J 3/36* (2013.01); *H01L 27/14649* (2013.01)

(58) Field of Classification Search
CPC .............................. G01J 3/36; H01L 27/14649
USPC .............................. 250/338.4, 370.01; 438/93
See application file for complete search history.

(56) References Cited

U.S. PATENT DOCUMENTS

| | | | | |
|---|---|---|---|---|
| 2004/0142504 | A1* | 7/2004 | Razeghi | 438/93 |
| 2005/0045910 | A1* | 3/2005 | Taylor et al. | 257/184 |
| 2006/0043297 | A1* | 3/2006 | Ouvrier-Buffet et al. | 250/339.05 |
| 2008/0111152 | A1* | 5/2008 | Scott et al. | 257/188 |
| 2009/0224229 | A1* | 9/2009 | Razeghi | 257/21 |

OTHER PUBLICATIONS

Lee et al., "Subband transitions in dual-band n-B-n InAs/GaSb superlattice infrared photodetector identified by photoresponse spectra" in Appl. Phys. Lett 95, 102106 (2009).
Maimon, et al., "nBn detector, an infrared", Appl. Phys. Lett. 89 151109 (2006).
A. Khoshakhlagh et al., "Bias dependent dual band response from InAs/GaInSb type II strain layer superlattice detectors", Applied Physics Letters 91, 263504 2007.
Delaunay, et al., "High quantum efficiency two color type-II InAs/GaSb n-i-p-p-i-n photidiodes", Northwestern University, Applied Physics Letter 92, 111112 (2008).

* cited by examiner

*Primary Examiner* — David Porta
*Assistant Examiner* — Abra Fein
(74) *Attorney, Agent, or Firm* — Ladas & Parry

(57) ABSTRACT

A dual band detector includes a substrate, a composite barrier, a first absorber on the substrate and on a light incident side of the composite barrier, the first absorber for detecting first infrared light wavelengths, a second absorber on the composite barrier on a side opposite the light incident side, the second absorber for detecting second infrared light wavelengths, wherein a bandgap of the first absorber is larger than that of the second absorber, wherein the composite barrier includes a first secondary barrier, a primary barrier, and a second secondary barrier, wherein the first and second secondary barriers may have a lower bandgap energy than the primary barrier, wherein the first or the second secondary barrier may have a doping level and type different from that of the primary barrier, and wherein at least the primary barrier blocks majority carriers and allows minority carrier flow.

47 Claims, 9 Drawing Sheets

| | Device layer | Function | Alloy | Band gap (eV) | λco at 150K (μm) | Lattice constant (Å) | Valence band offset wrt red band absorber (meV) | % lattice mismatch with red band absorber |
|---|---|---|---|---|---|---|---|---|
| 40 MW1/MW2 detector | 42 MWIR red band absorber | Absorber to create e-h pairs | InAs₀.₉₁Sb | 0.237 | 5.23 | 6.147 | 0 | 0 |
| | MWIR blue band absorber | Absorber to create e-h pairs | AlIn₀.₁₃As₀.₅₇₇Sb | 0.3588 | 3.46 | 6.147 | -11.8 | 0 |
| | MWIR blue band absorber (alternative material) | Absorber to create e-h pairs | Ga0.5In0.5As0.314Sb0.686 | 0.3 | 4.14 | 6.147 | +232 | 0 |
| | Primary barrier | Blocks majority carriers, allows minority carrier flow | AlIn₀.₀₄₄Sb | 2.24 | 0.554 | 6.147 | 68.2 | 0 |
| | Secondary barrier | Lower bandgap as compared to primary barrier; doping in this layer can be adjusted to minimize field in absorbers | AlIn₀.₀₄As₀.₉₅₅Sb | 0.7833 | 1.583 | 6.147 | -15 | 0 |
| 50 SW/MW MWIR detector | 52 MWIR red band absorber | Absorber to create e-h pairs | InAs₀.₉₁Sb | 0.237 | 5.23 | 6.147 | 0 | 0 |
| | SWIR blue band absorber | Absorber to create e-h pairs | Al0.27In0.73As0.54Sb0.46 | 0.555 | 2.24 | 6.147 | -17.2 | 0 |
| | 54 SWIR blue band absorber (alternative material) | Absorber to create e-h pairs | Ga0.85InSb | 0.6417 | 1.932 | 6.147 | 435 | 0 |
| | SWIR blue band absorber (alternative material) | Absorber to create e-h pairs | Al0.955In0.045Sb | 2.24 | 0.539 | 6.147 | 68.7 | 0 |
| | Primary barrier | Blocks majority carriers, allows minority carrier flow | AlIn₀.₀₄₄Sb | 2.24 | 0.554 | 6.147 | 68.2 | 0 |
| | Secondary barrier | Lower bandgap as compared to primary barrier; doping in this layer can be adjusted to minimize field in absorbers | AlIn₀.₀₄As₀.₉₅₅Sb | 0.7833 | 1.583 | 6.147 | -15 | 0 |

FIG. 2E

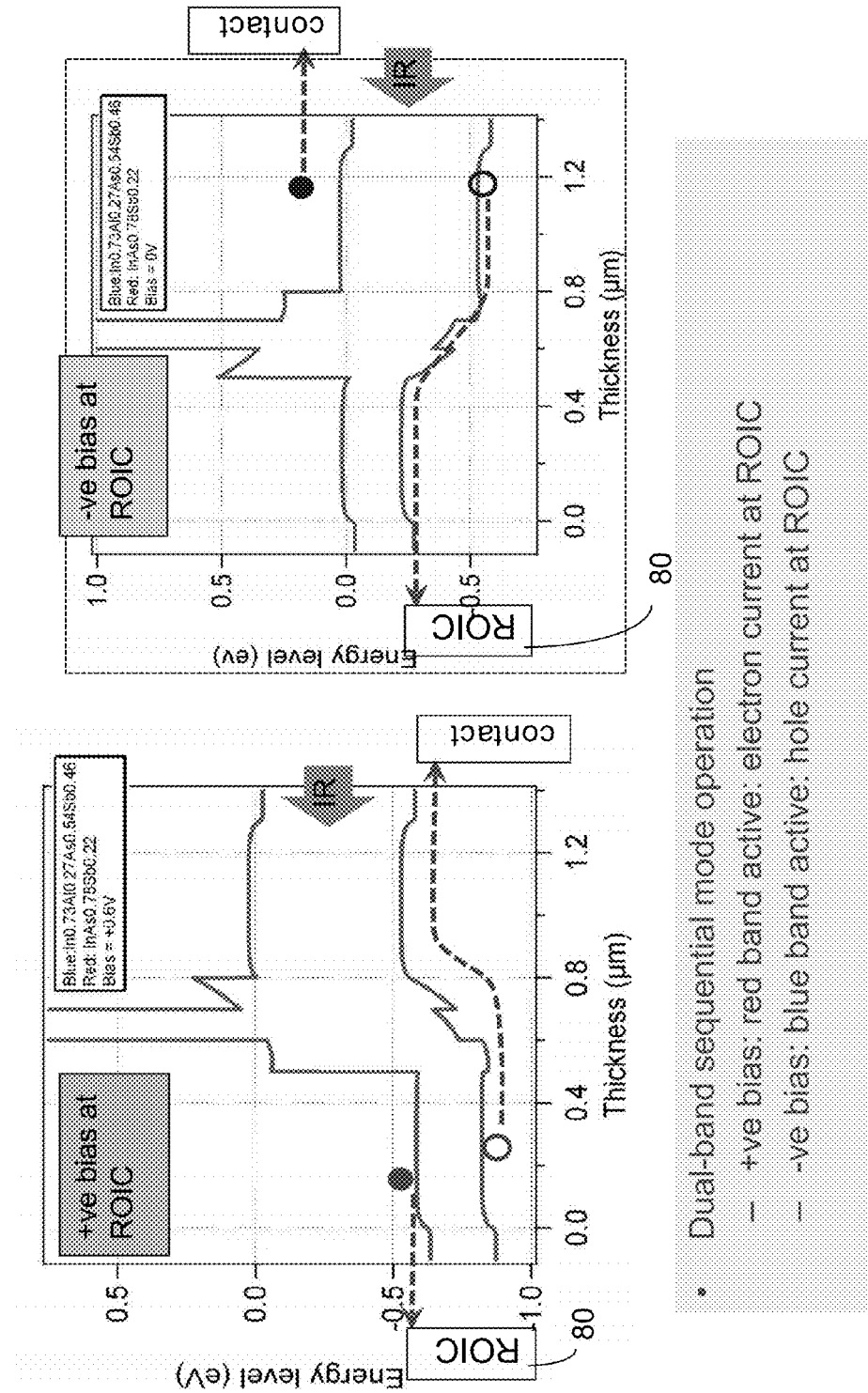
FIG. 5 Red or Blue band detection by sequentially switching bias

DUAL BAND SWIR/MWIR AND MWIR1/MWIR2 INFRARED DETECTORS

CROSS REFERENCE TO RELATED APPLICATIONS

None

TECHNICAL FIELD

This disclosure relates to infrared detectors and in particular to dual band infrared detectors.

BACKGROUND

Dual band infrared (IR) detectors have been made using HgCdTe, quantum well infrared photo-detectors (QWIPs), and Type II superlattice (T2SL) materials. HgCdTe detectors have high performance, and although significant progress has been made in the development of HgCdTe detectors for MW (medium wavelength)/LW (long wavelength), LW1/LW2, and MW1/MW2 dual-band detectors, HgCdTe based infrared detectors have high cost and are difficult to scale to large detector arrays. QWIPs and InAs/GaSb T2SL detectors have the disadvantage of ~10-100 times higher dark current as compared to HgCdTe. InAs/GaSb T2SL detectors have low minority carrier lifetimes which prevent FPA (focal plane array) operation at temperatures greater than 150 Kelvin.

Elevated temperature operation is essential for large format FPAs in order to minimize the size, weight and power footprint of an infrared (IR) imaging system.

In the prior art, InAsSb-based single-band/single color devices are described by Maimon and Wicks, Appl. Phys. Lett. 89 151109 (2006). Lee et al., "Subband transitions in dual-band n-B-n InAs/GaSb superlattice infrared photodetector identified by photoresponse spectra" in Appl. Phys. Lett 95, 102106 (2009) describes work by the University of New Mexico using T2SLs. The use of InAs/GaSb T2SL materials for dual band detectors is described by A. Khoshakhlagh et al., "Bias dependent dual band response from InAs/GaInSb type II strain layer superlattice detectors", APPLIED PHYSICS LETTERS 91, 263504 __2007. A method for producing a single-bump, dual-band detector for LWIR and VLWIR devices using pNp or n-p-B-p-n T2SL is described by Northwestern University in Applied Physics Letter 92, 111112 (2008).

What is needed is a dual band detector and method of making a dual band detector that is cost effective and that can be scaled up to greater than 4 k×4 k FPA formats, while providing HgCdTe-like performance. Also needed is a dual band detector that allows for elevated temperature operation, which is essential for large format FPAs in order to minimize the size, weight and power footprint of an infrared (IR) imaging system. The embodiments of the present disclosure answer these and other needs.

SUMMARY

In a first embodiment disclosed herein, a dual band detector comprises a substrate, a composite barrier, a first absorber on the substrate and on a light incident side of the composite barrier, the first absorber for detecting first infrared light wavelengths, a second absorber on the composite barrier on a side opposite the light incident side, the second absorber for detecting second infrared light wavelengths, wherein a bandgap of the first absorber is larger than that of the second absorber, wherein the composite barrier comprises a first secondary barrier, a primary barrier, and a second secondary barrier, wherein the first and second secondary barriers may have a lower bandgap energy than the primary barrier, wherein the first or the second secondary barrier may have a doping level and type different from that of the primary barrier, and wherein at least the primary barrier blocks majority carriers and allows minority carrier flow.

In another embodiment disclosed herein, a method of fabricating a dual band detector comprises forming a first absorber on a substrate, the first absorber for detecting infrared light having first wavelengths, wherein a bandgap of the first absorber is larger than that of the second absorber, forming a composite barrier on the first absorber, the composite barrier comprising a first secondary barrier, a primary barrier, and a second secondary barrier, wherein the first and second secondary barriers may have a lower bandgap energy than the primary barrier, wherein the first or the second secondary barrier may have a doping level and type different from that of the primary barrier, wherein the first or the second secondary barrier may have a doping level that ranges in magnitude from $1\times10^{14}$ cm$^{-3}$ to $1\times10^{18}$ cm$^{-3}$, and wherein at least the primary barrier blocks majority carriers and allows minority carrier flow, and forming a second absorber on the composite barrier, the second absorber for detecting infrared light having second wavelengths.

These and other features and advantages will become further apparent from the detailed description and accompanying figures that follow. In the figures and description, numerals indicate the various features, like numerals referring to like features throughout both the drawings and the description.

BRIEF DESCRIPTION OF THE DRAWINGS

FIG. 2E shows the properties of layers in a dual-band detector in accordance with the present disclosure;

FIG. 5 shows operational modes for the detection of red or blue bands and the corresponding energy band diagram and biasing scheme in accordance with the present disclosure.

DETAILED DESCRIPTION

In the following description, numerous specific details are set forth to clearly describe various specific embodiments disclosed herein. One skilled in the art, however, will understand that the presently claimed invention may be practiced without all of the specific details discussed below. In other instances, well known features have not been described so as not to obscure the invention.

In this disclosure, dual band MWIR1 (medium wavelength IR band 1)/MWIR2 (medium wavelength IR band 2) and dual band SWIR (short wavelength IR band)/MWIR (medium wavelength IR band) device structures which utilize bulk InAsSb-based absorber layers are described. These detectors are based on an n-compound barrier-n (n-CB-n) architecture and offer significant advantages in cost, scalability and fabrication methods, as compared to HgCdTe detectors. These dual band detectors also offer a significant advantage in providing for greater than 150 Kelvin (K) temperature operation. The designs described herein may be used for the fabrication of single bump per pixel, sequential-mode dual band detectors, or a two-bump per pixel simultaneous-mode, dual-band detector. As described in the present disclosure InAs-based ternary and quaternary alloys may be used for providing a response in the MWIR and SWIR bands. The III-V dual-band devices and methods for fabricating n-CB-n dual-band detectors in accordance with the present disclosure provide cost effective and scalable detectors with HgCdTe-like performance.

The advantages of fabricating dual-band devices using InAsSb based alloys include long minority carrier lifetimes of approximately 1 microsecond, which is comparable to HgCdTe and approximately 10-50 times higher than T2SL alloys, a robust fabrication infrastructure and high yield processes as compared to HgCdTe, and large substrates, such as GaSb, GaAs or InP substrates, that are available in greater than or equal to four (4) inches in diameter size, and which provide a direct pathway for scaling up to large size FPA formats.

Figure 1:
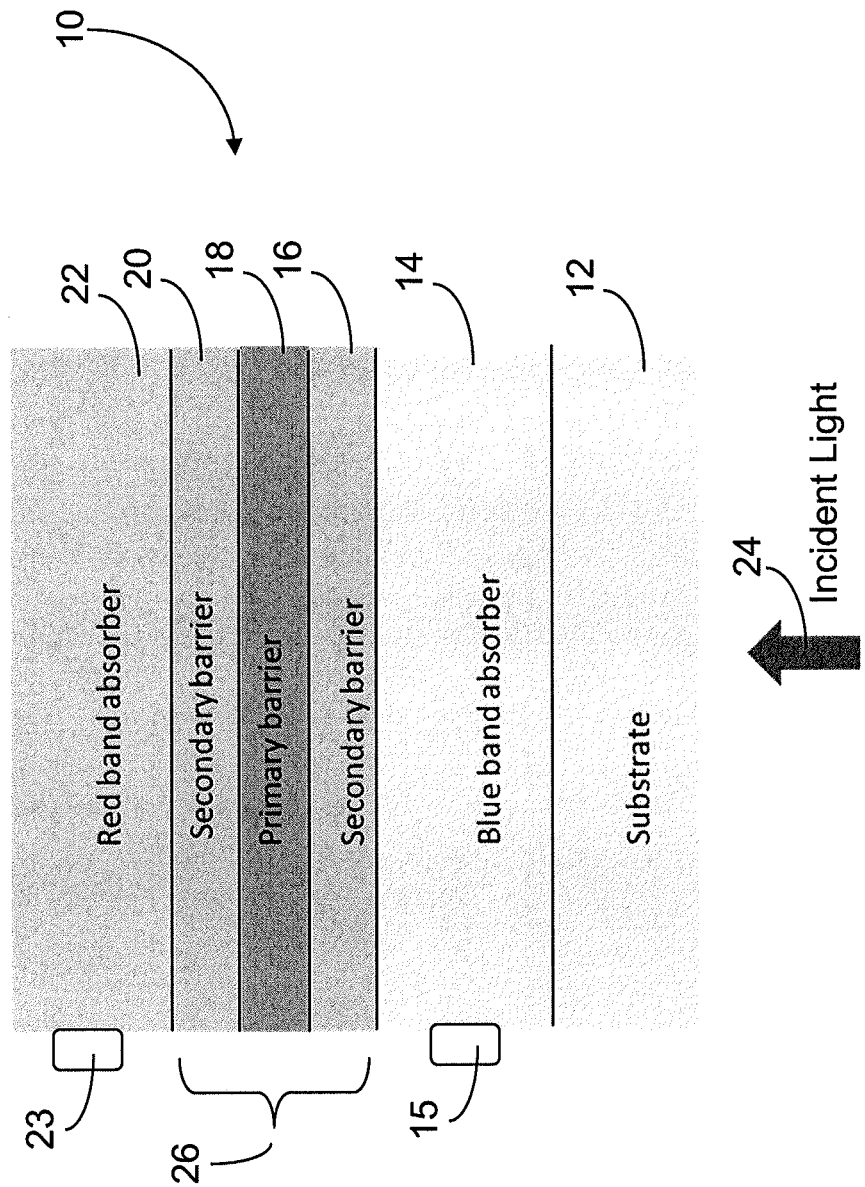
FIG. 1 shows layers in an n-compound barrier-n dual-band detector in accordance with the present disclosure.

FIG. 1 shows layers in an n-compound barrier-n dual-band detector in accordance with the present disclosure and FIGS. 2A-2D show mesa isolated dual-band detectors in accordance with the present disclosure.

FIG. 1 shows a dual band detector 10 in accordance with the present disclosure and in particular the layers of the dual band detector 10. The substrate 12 provides support for the other layers, and the substrate is preferably transparent for infrared and laser designator wavelengths. Following the hybridization of the detector to a supporting structure such as a read-out circuit, the substrate may be selectively removed for enhanced thermal cycle reliability. The substrate 12 may include multiple nucleation and buffer layers. Incident light 24 shines through the substrate 12 to the other layers. The layers on the substrate 12 are a blue band absorber layer 14, a composite barrier 26 including secondary barrier 16, primary barrier 18, and another secondary barrier 20, and a red band absorber layer 22. A first electrical contact 15 makes contact to the blue band absorber layer 14 and a second electrical contact 23 makes contact to the red band absorber layer 22.

Figure 2A:
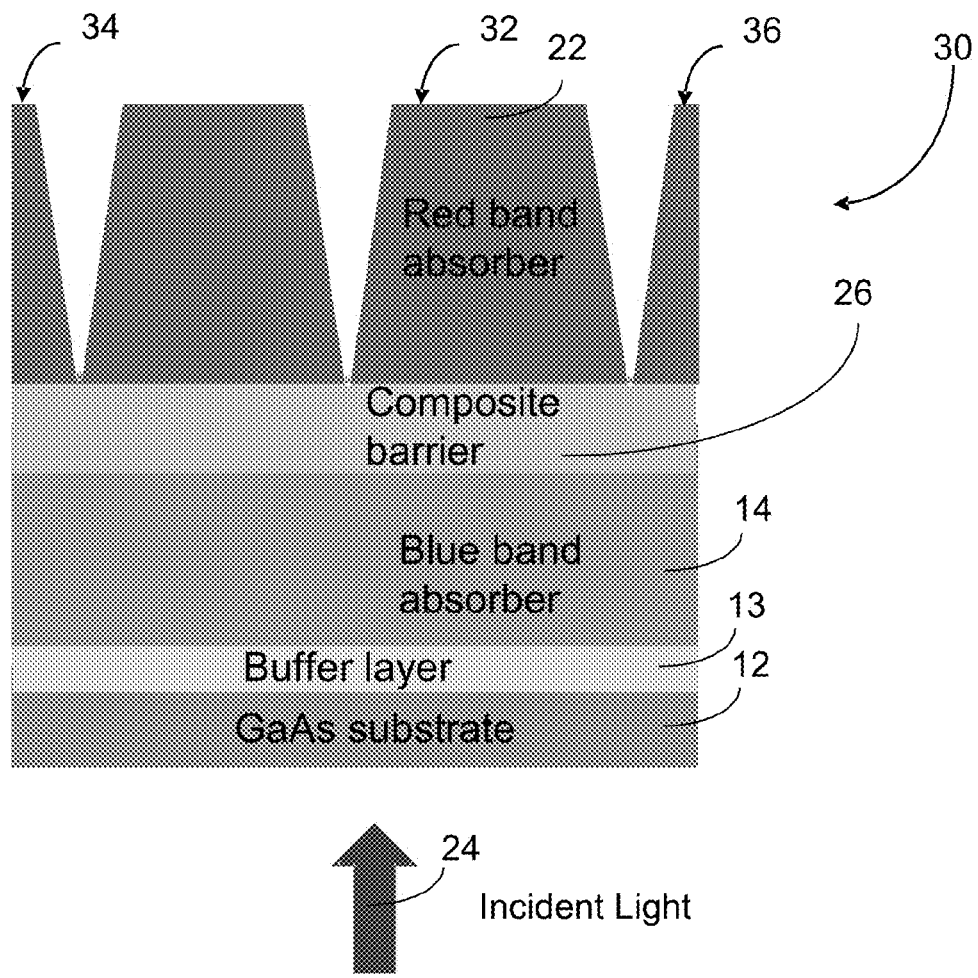
FIGS. 2A-C show sequential mode dual-band detectors in accordance with the present disclosure.

FIG. 2A shows a mesa dual band device 30 fabricated by etching through the red band absorber 22 to form a mesa for isolating, for example, pixel 32 from pixel 34 and pixel 36. Wet etch or dry etch processes, combined with lithographic patterning can be used to fabricate the mesa structures.

Figure 2B:
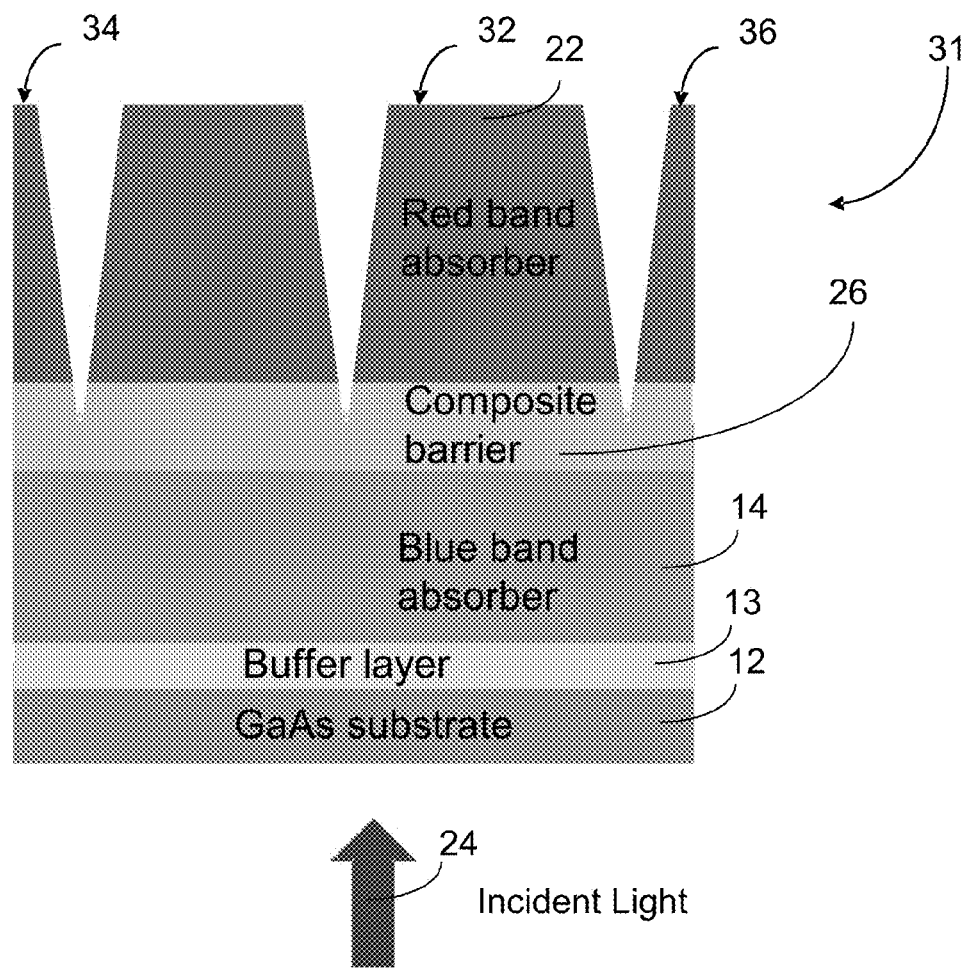

In another embodiment FIG. 2B shows a mesa dual band device 31 fabricated by etching through the red band absorber 22 and a portion of the composite barrier 26 to form a mesa for isolating, for example, pixel 32 from pixel 34 and pixel 36.

Figure 2C:
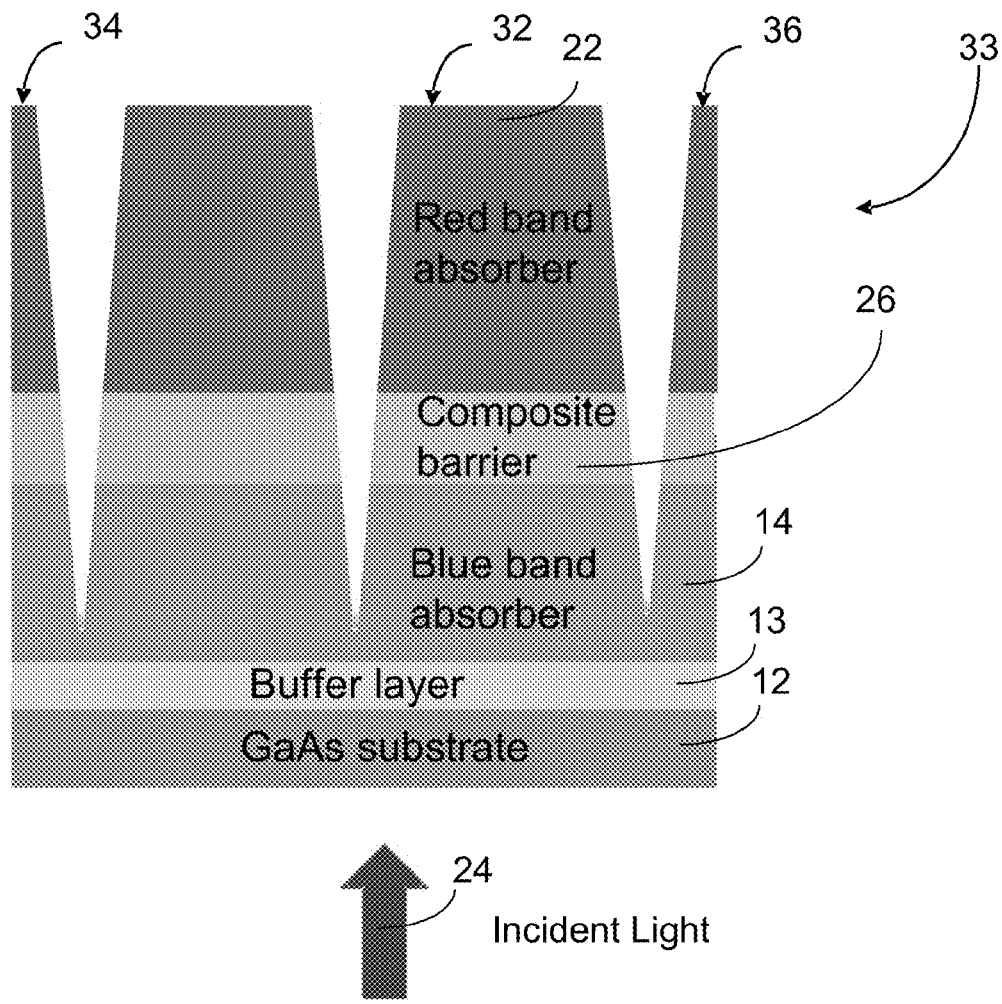
Figure 2D:
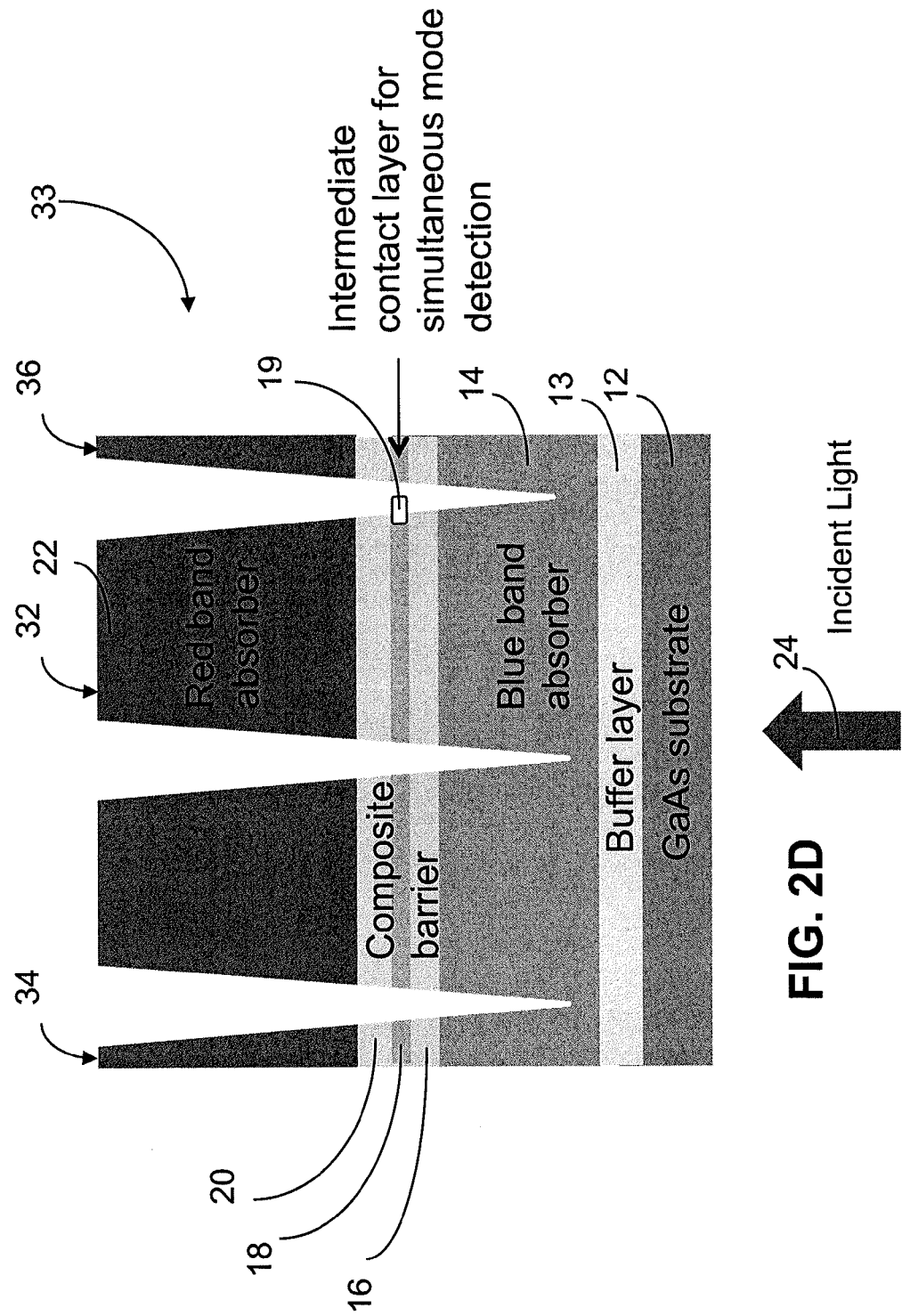
FIG. 2D shows a simultaneous mode detector which is a three terminal device thus requiring two contacts per pixel in addition to the common ground in accordance with the present disclosure.

In yet another embodiment FIG. 2C shows a mesa dual band device 33 fabricated by etching through the red band absorber 22, the composite barrier 26, and a portion of the blue band absorber 14 to form a mesa for isolating, for example, pixel 32 from pixel 34 and pixel 36. FIG. 2D shown another view of the mesa dual band device 33 showing that the composite barrier 26 includes secondary barrier 16, primary barrier 18, which includes a contact layer, and another secondary barrier 20, as shown in FIG. 1. An electrical contact 19 makes contact to the primary barrier 18. The mesa dual band devices 30 and 31 also have a n-compound barrier-n composite barrier 26 that includes secondary barrier 16, primary barrier 18, and another secondary barrier 20.

FIG. 2E lists the properties of the layers for a MWIR1/MWIR2 dual band detector 40 and for a SWIR/MWIR dual band detector 50 in accordance with the present disclosure. The properties for each layer include: the layer name 60, the layer function 61, alloy composition 62, band gap 63, wavelength 64, lattice constant 65, valence band offset with respect to the red band absorber 66, and the percent lattice mismatch with respect to the red band absorber 67. The properties of the quaternary and ternary alloys were calculated using data from the binary alloys such as InAs, InSb, GaAs, GaSb, AlAs, AlSb found in the prior art literature.

The detector structure can be grown lattice mismatched on a substrate which consists of one or more nucleation and buffer layers. As such lattice matching of the epilayer with the substrate is not necessary. Vapor phase epitaxial growth techniques such as molecular beam epitaxy (MBE) or metalorganic chemical vapor deposition (MOCVD) can be used to grow the layers.

Lattice matching may be maintained between the layers in the both the MWIR1/MWIR2 dual band detector 40 and for the SWIR/MWIR dual band detector 50, as shown by the percent lattice mismatch 67, which indicates substantially zero lattice mismatch. Lattice matching across the layers provides higher device reliability, better noise (1/f and dark current) performance and focal plane array (FPA) uniformity. However, maintaining a lattice matched structure across the device stack does complicate the device design and growth of material, because quaternary layers need to maintain lattice matching conditions during growth. The growth of a quaternary layer with a thickness of greater than 5 µm requires precise control of the constituent flux during molecular beam epitaxy (MBE) growth which adds yet another layer of complexity in the fabrication of dual band devices in accordance with the present disclosure.

Alternatively, the lattice constants of the various layer consisting of the absorber layers and barrier layers may be mismatched with respect to each other and the substrate, especially if the device is operated at elevated temperatures where the dominant dark current mechanism is diffusion current, and not dominated by generation-recombination current associated with defects.

The exemplary MWIR1/MWIR2 dual band detector 40 shown in FIG. 2E has a ternary alloy $InAs_{0.78}Sb_{0.22}$ red band absorber $\lambda_{co}$=5.23 µm and a lattice matched quaternary alloy $Al_{0.12}In_{0.88}As_{0.67}Sb_{0.33}$ blue band absorber $\lambda_{co}$=3.5 µm at 150K, which provide MWIR1 and MWIR2 detectors, respectively. The cut off wavelengths of these exemplary red band and the blue bands have been chosen, as an example, to bracket the 3-5 µm MWIR spectrum. This example provides a blue response at approximately 3 µm and a red response at approximately 5 µm. Depending on the application of the device, it may be necessary to increase the cutoff wavelength such that the blue band is sensitive at a longer wavelength, within the MWIR band. By reducing the Al mole fraction from 0.22 to 0 and simultaneously increasing the As mole fraction from 0.67 to 0.78, a family of lattice matched absorbers can be provided whose $\lambda_{co}$ can be adjusted and tuned over the entire MWIR spectrum, while preserving lattice match.

An alternative blue band absorber 42 is also shown in FIG. 2E for the MWIR1/MWIR2 dual band detector 40. The alternative blue band absorber is a quaternary alloy $Ga_{0.5}In_{0.5}As_{0.314}Sb_{0.686}$, $\lambda_{co}$=4.14 µm at 150K. Alternatively, the blue band absorber can be lattice mismatched and consist of the binary alloy InAs.

The composite barrier 26 for the MWIR1/MWIR2 dual band detector 40 is shown in FIG. 2E to include a secondary barrier 16 of $Al_{0.4}In_{0.6}As_{0.43}Sb_{0.57}$, a primary barrier 18, which blocks majority carriers and allows minority carrier flow, of $Al_{0.956}In_{0.044}Sb$, and another secondary barrier 20 of $Al_{0.4}In_{0.6}As_{0.43}Sb_{0.57}$. The secondary barriers 16 and 20 have a lower bandgap energy 63 as compared to the primary barrier 18. The doping level and type in the secondary barrier may be adjusted to minimize the electric fields in the blue band absorber 14 and the red band absorber 22. Minimizing the electric field in the absorbers results in minimal band bending, which in turn results in reduced dark (generation-recombination) current.

The doping type and level in the primary barrier is such that it allows transport of the minority carriers generated in either of the absorbers across the primary barrier.

Figure 3:
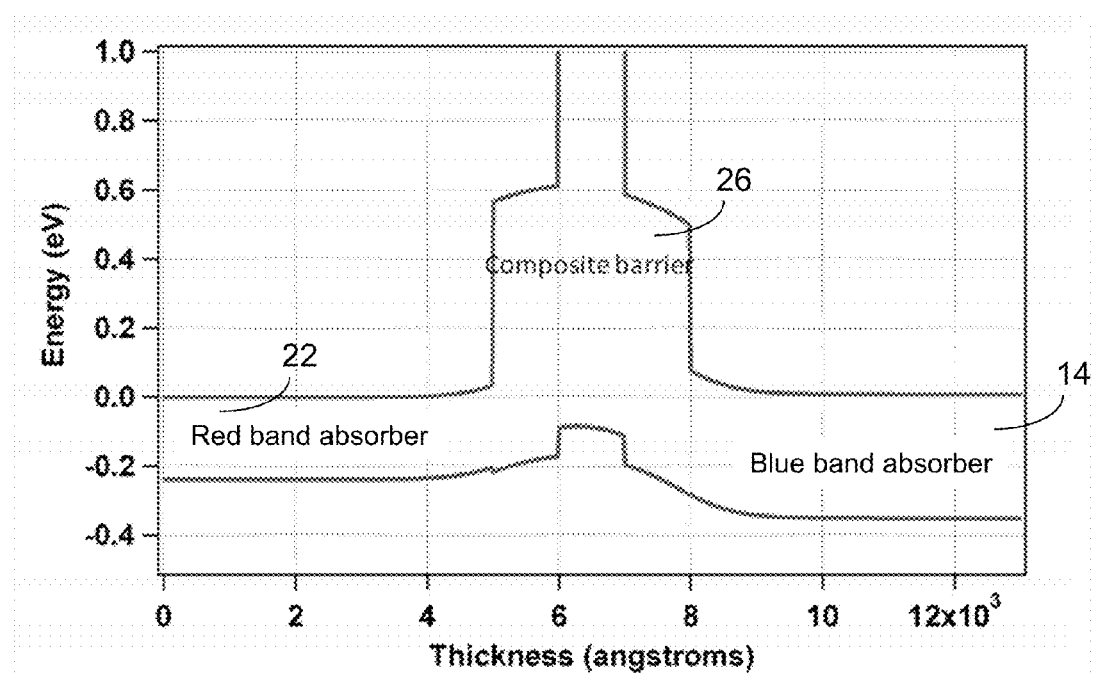
FIG. 3 shows a Poisson band bending model for a MWIR1/MWIR2 dual-band detector in accordance with the present disclosure.

A Poisson band bending model for the exemplary MWIR1/MWIR2 dual band detector 40 of FIG. 2E, is shown in FIG. 3, which illustrates the near-flat absorber regions that serve to minimize generation-recombination (G-R) dark current. FIG. 3 depicts the thicknesses of the red band absorber 22, the composite barrier 26, and the blue band absorber 14, and the band bending in the red band absorber 22, the composite barrier 26, and the blue band absorber 14.

Figure 4:
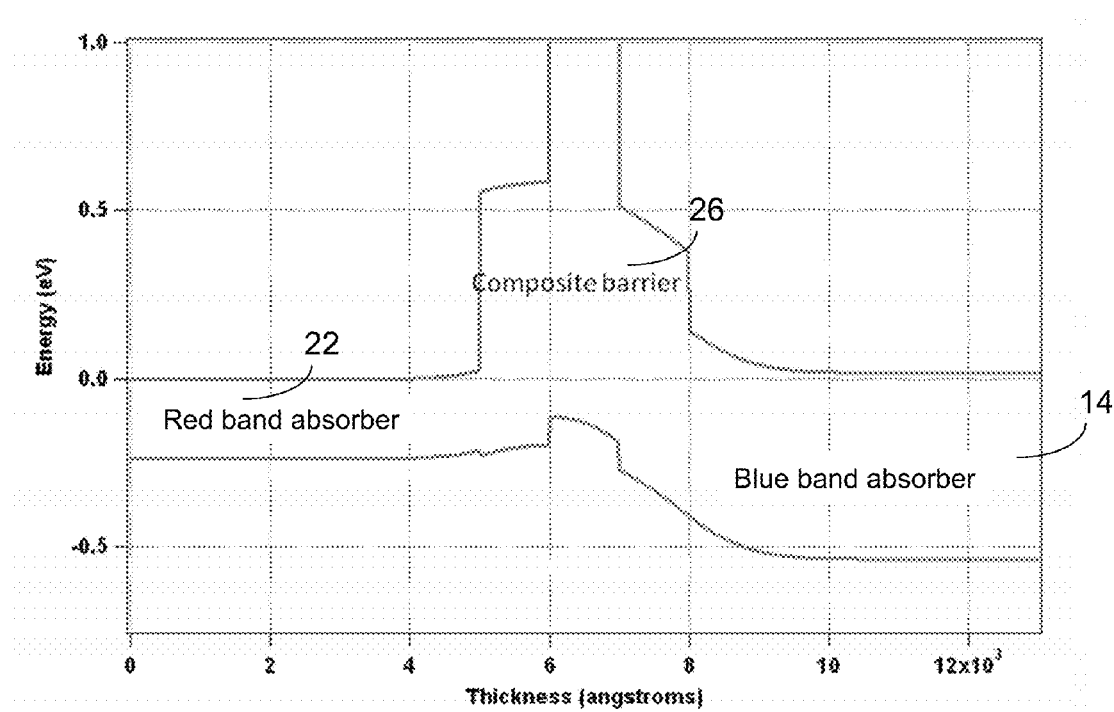
FIG. 4 shows a Poisson band bending model for a dual-band SWIR (short wavelength IR)/MWIR (medium wavelength IR) detector in accordance with the present disclosure.

A Poisson band bending model at zero bias for the SWIR/MWIR dual band detector is shown in FIG. 4.

FIG. 5 illustrates the operation of an exemplary dual band SW/MW device. Applying a positive bias to the red band absorber 22 tilts the bands and allows detection of the red band or the longer wavelength photons through the collection of red-band generated photo electrons at the read out integrated circuit (ROIC) 80. As shown in FIG. 5, the application of a negative bias to the red band absorber 22 tilts the bands and allows detection of the blue band, or the longer wavelength photons through the collection of the blue-band generated holes (photo carriers) in the ROIC 80.

The operation of a dual-band device where the absorbers are doped n-type is described above. The same principle can be applied to operate a device where the absorbers are doped p-type. For the device with p-type absorbers, when a positive bias is applied to the second absorber, the bands are tilted such that photogenerated electrons from the first absorber are collected at a ROIC. When a negative bias is applied to the second absorber, the photogenerated holes from the second absorber are collected at the ROIC.

The exemplary SWIR/MWIR dual band detector 50 shown in FIG. 2E has a red band absorber 22 of ternary alloy $InAs_{0.78}Sb_{0.22}$, $\lambda_{co}$=5.23 μm, and a lattice matched blue band absorber 14 of quaternary alloy $In_{0.73}Al_{0.27}As_{0.54}Sb_{0.46}$, $\lambda_{co}$=2.24 μm at 150 K, which provide MWIR and SWIR absorbers, respectively.

Alternate blue band absorbers 52 and 54 are also shown in FIG. 2E for the SWIR/MWIR dual band detector 50. The alternate blue band absorber 52 is ternary alloy $Ga_{0.85}InSb$, $\lambda_{co}$=1.932 μm at 150K. The alternate blue band absorber 54 may be ternary $Al_{0.955}In_{0.045}Sb$, $\lambda_{co}$=0.539 μm at 150K.

The composite barrier 26 for the SWIR/MWIR dual band detector 50 is shown in FIG. 2E to be the same as the composite barrier 26 for the MWIR1/MWIR2 dual band detector 40.

Dual band arrays have many applications including, for example, target identification, clutter rejection, and tracking of a $CO_2$ emission.

Another benefit of a dual band detector in accordance with the present disclosure is the ability to image a laser designator spot and overlay the spot in an IR image of the scene by independently optimizing the integration times for the detection of the laser spot and the scene.

In accordance with the present disclosure, high intensity laser light with, for example, a wavelength of 1.06 or 1.55 μm may be entirely absorbed in a SWIR absorber layer, such as blue band absorber 14. Thus, the integration time in the red band absorber 22 may be optimized to increase the signal to noise (S/N). The integration time can be optimized based on the read out integrated circuit (ROIC) 80 well capacity, the detector noise and incident light 24 flux. The blue band absorber 14 of the dual-band sensor in accordance with the present disclosure may be used to image the laser designator spot using an integration time sufficient to capture a sequence of pulses, and the red band absorber 22 may be used to image the scene using a different optimal integration time.

The dual band detector 10 or 30 allows co-located pixels in a common optical bore sight to detect both a laser designator spot and a thermal image of a dim scene. Most SWIR detectors in the prior art are blind at 1.06 μm, and most prior art MWIR detectors are blind at 1.06 and 1.55 μm light due the presence of the opaque substrate used for epi growth. Detection of 1.06 μm and 1.55 μm wavelength laser designators, in the dual band detector 10 or 30 in accordance with the present disclosure may be facilitated by:

1) A fabrication process that provides for the removal of the opaque epi-growth substrate and the transfer of the epi layer onto a suitable transparent permanent substrate, and 2) Use of a unique backside process for FPA fabrication wherein the light is incident directly on the absorber without having to traverse through a substrate. According to an embodiment of the present disclosure, the support for an epi layer may be provided by an indium-bump-hybridized ROIC.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A dual band detector comprising:
   a substrate;
   a composite barrier;
   a first absorber on the substrate and on a light incident side of the composite barrier, the first absorber for detecting light of a first range of infrared wavelengths;
   a second absorber on the composite barrier on a side opposite the light incident side, the second absorber for detecting light of a second range of infrared wavelengths;
   wherein a bandgap of the first absorber is larger than that of the second absorber;
   wherein the composite barrier comprises:
      a first secondary barrier;
      a primary barrier; and
      a second secondary barrier;
         wherein the first and second secondary barriers have a lower bandgap energy than the primary barrier;
         wherein the first or the second secondary barrier have a doping level and type different from that of the primary barrier; and
         wherein at least the primary barrier blocks majority carriers and allows minority carrier flow.

2. The dual band detector of claim 1 wherein first and second absorbers comprise indium.

3. The dual band detector of claim 1 further comprising:
   a first electrical contact on the first absorber; and
   a second electrical contact on the second absorber.

4. The dual band detector of claim 1 wherein the substrate is selectively removed.

5. The dual band detector of claim 1 wherein the substrate is transparent to incident infrared wavelengths.

6. The dual band detector of claim 1 wherein:
   the first and second secondary barriers are graded in composition.

7. The dual band detector of claim 1 wherein:
   the first or the second secondary barrier has a doping level that ranges in magnitude from $1\times10^{14}$ cm$^{-3}$ to $1\times10^{18}$ cm$^{-3}$.

8. The dual band detector of claim 1 wherein the primary barrier further comprises:
   a contact layer; and
   a third contact to the contact layer.

9. The dual band detector of claim 1 wherein:
   the first absorber, the second absorber and the composite barrier comprise indium and one or more of the following: Al, Ga, As, Sb or N.

10. The dual band detector of claim 1 wherein:
    at least one of the first absorber, the second absorber, or the primary barrier comprises a binary alloy, a ternary alloy, or a quaternary alloy.

11. The dual band detector of claim 1 wherein:
    the first absorber and the second absorber have band gaps appropriate for detection of infrared radiation in the 3 to 5 micron band for detecting mid-wave infrared radiation (MWIR).

12. The dual band detector of claim 1 wherein:
    the second absorber is a ternary alloy comprising InAsSb or a quaternary alloy of AlInAsSb; and
    the first absorber is a quaternary alloy of AlInAsSb, a quaternary alloy of GaInAsSb, a ternary alloy consisting substantially of GaInSb, a ternary alloy consisting substantially of AlInSb, a ternary alloy consisting substantially of InAsSb, or a binary alloy InAs.

13. The dual band detector of claim 1 wherein:
    at least one of the first and second absorbers are superlattices, whose individual layers are comprised substantially of InAs and InAsSb with band gaps suitable for the detection of MWIR radiation.

14. The dual band detector of claim 1 wherein:
    at least one of the first and second absorbers are superlattices whose individual layers are comprised substantially of InAs and GaInSb or alternatively InAs and GaSb.

15. The dual band detector of claim 1 wherein:
    the second absorber is a ternary alloy InAs$_{0.78}$Sb$_{0.22}$; and
    the first absorber is a quaternary alloy Al$_{0.12}$In$_{0.88}$As$_{0.67}$Sb$_{0.33}$;
    wherein
    the second absorber has a $\lambda_{co}$=5.2 µm at 150K; and
    the first absorber has a $\lambda_{co}$=3.5 µm at 150K.

16. The dual band detector of claim 1 wherein:
    the second absorber is a ternary alloy InAs$_{0.78}$Sb$_{0.22}$; and
    the first absorber is InAs.

17. The dual band detector of claim 1 wherein:
    the second absorber is a ternary alloy InAs$_{0.78}$Sb$_{0.22}$; and
    the first absorber is a quaternary alloy Ga$_{0.5}$In$_{0.5}$As$_{0.3145}$Sb$_{0.686}$;
    wherein
    the second absorber has a $\lambda_{co}$=5.23 µm at 150K; and
    the first absorber has a $\lambda_{co}$=4.14 µm at 150K.

18. The dual band detector of claim 1 wherein:
    the first secondary barrier is an alloy of AlGaInAsSb, or an alloy consisting substantially of AlAsSb or an alloy consisting substantially of AlGaSb;
    the primary barrier is AlSb or an alloy of AlInGaAsSb, or an alloy consisting substantially of AlAsSb or an alloy consisting substantially of AlGaSb; and
    the second secondary barrier is an alloy of AlGaInAsSb, or an alloy consisting substantially of AlAsSb or an alloy consisting substantially of AlGaSb.

19. The dual band detector of claim 1 wherein:
    the first secondary barrier is Al$_{0.4}$In$_{0.6}$As$_{0.43}$Sb$_{0.57}$;
    the primary barrier is Al$_{0.956}$In$_{0.044}$Sb; and
    the second secondary barrier is Al$_{0.4}$In$_{0.6}$As$_{0.43}$Sb$_{0.57}$.

20. The dual band detector of claim 1 wherein:
    the second absorber has a band gap suitable for detection of medium wavelength infrared (MWIR) radiation of 3 to 5 microns; and
    the first absorber has a band gap suitable for the detection of short-wave wavelength infrared (SWIR) radiation of 1.0 to 2.5 microns.

21. The dual band detector of claim 1 wherein:
    the second absorber is a ternary alloy InAs$_{0.78}$Sb; and
    the first absorber is a quaternary alloy In$_{0.73}$Al$_{0.27}$As$_{0.54}$Sb$_{0.46}$;
    wherein
    the second absorber has a $\lambda_{co}$=5.2 µm at 150K; and
    the first absorber has a $\lambda_{co}$=2.2 µm at 150K.

22. The dual band detector of claim 1 wherein:
    the second absorber is a ternary alloy InAs$_{0.78}$Sb$_{0.22}$; and
    the first absorber is a ternary alloy Ga$_{0.85}$In$_{0.15}$Sb;
    wherein
    the second absorber has a $\lambda_{co}$=5.2 µm at 150K; and
    the first absorber has a $\lambda_{co}$=1.9 µm at 150K.

23. The dual band detector of claim 1 wherein:
    the second absorber is a ternary alloy InAs$_{0.78}$Sb$_{0.22}$; and
    the first absorber is a ternary alloy Al$_{0.955}$In$_{0.045}$Sb;

wherein
the second absorber has a $\lambda_{co}$=5.2 μm at 150K; and
the first absorber has a $\lambda_{co}$=0.54 μm at 150K.23.

24. The dual band detector of claim 1 wherein:
when a positive bias is applied to the second absorber, the second infrared wavelengths generate electrons in the second absorber that are collected at a read out integrated circuit; and
when a negative bias is applied to the second absorber, the first infrared wavelengths generate holes in the first absorber that are collected at the read out integrated circuit.

25. The dual band detector of claim 1 wherein:
when a positive bias is applied to the second absorber, the first infrared wavelengths generate electrons in the first absorber that are collected at a read out integrated circuit; and
when a negative bias is applied to the second absorber, the second infrared wavelengths generate holes in the second absorber that are collected at the read out integrated circuit.

26. The dual band detector of claim 1 wherein:
the dual band detector operates at temperatures equal to or greater than 100K.

27. The dual band detector of claim 1 wherein:
the second absorber, the composite barrier, and a portion of the first absorber form a mesa;
wherein the mesa forms one pixel of a focal plane array having a plurality of mesas forming a plurality of pixels.

28. The dual band detector of claim 1 wherein:
the second absorber, and a portion of the composite barrier form a mesa;
wherein the mesa forms one pixel of a focal plane array having a plurality of mesas forming a plurality of pixels.

29. The dual band detector of claim 1 wherein:
the second absorber forms a mesa;
wherein the mesa forms one pixel of a focal plane array having a plurality of mesas forming a plurality of pixels.

30. The dual band detector of claim 1 wherein:
the second absorber is a ternary alloy $InAs_{0.78}Sb_{0.22}$; and
the first absorber is an alloy of indium comprising of one or more of the following elements: Ga, Al, As, Sb and N.

31. A method of fabricating a dual band detector comprising: forming a first absorber on a substrate, the first absorber for detecting infrared light having first wavelengths; wherein a bandgap of the first absorber is larger than that of a second absorber; forming a composite barrier on the first absorber, the composite barrier comprising: a first secondary barrier a primary barrier and a second secondary barrier; wherein the first and second secondary barriers may have a lower bandgap energy than the primary barrier; wherein the first or the second secondary barrier may have a doping level and type different from that of the primary barrier; wherein the first or the second secondary barrier may have a doping level that ranges in magnitude from $1\times10^{14}$ cm$^{-3}$ to $1\times10^{18}$ cm$^{-3}$; and wherein at least the primary barrier blocks majority carriers and allows minority carrier flow; and forming the second absorber on the composite barrier, the second absorber for detecting infrared light having second wavelengths.

32. The method of claim 31 wherein first and second electrical contacts are made to the first and second absorbers, respectively.

33. The method of claim 31 further comprising selectively removing the substrate.

34. The method of claim 31 wherein the substrate is transparent to incident first and second infrared wavelengths.

35. The method of claim 31 wherein: the primary barrier further comprises a contact layer; and, a contact to the contact layer.

36. The method of claim 31 wherein:
the first absorber, the second absorber and the composite barrier comprise indium and one or more of the following: Al, Ga, As, Sb, or N.

37. The method of claim 31 wherein:
the first secondary barrier is an alloy of AlGaInAsSb, or an alloy consisting substantially of AlAsSb or an alloy consisting substantially of AlGaSb;
the primary barrier is AlSb or an alloy of AlInGaAsSb, or an alloy consisting substantially of AlAsSb or an alloy consisting substantially of AlGaSb; and
the second secondary barrier is an alloy of AlGaInAsSb, or an alloy consisting substantially of AlAsSb or an alloy consisting substantially of AlGaSb.

38. The method of claim 31 wherein:
the first secondary barrier is $Al_{0.4}In_{0.4}As_{0.43}Sb_{0.57}$;
the primary barrier is $Al_{0.956}In_{0.044}Sb$; and
the second secondary barrier is $Al_{0.4}In_{0.6}As_{0.43}Sb_{0.57}$.

39. The method of claim 31 comprising:
etching through the composite barrier to form a mesa having the second absorber, the composite barrier, and the portion of the first absorber;
wherein the mesa forms one pixel of a focal plane array having a plurality of mesas forming a plurality of pixels.

40. The method of claim 31 comprising:
etching through the second absorber, and a portion of the composite barrier to form a mesa;
wherein the mesa forms one pixel of a focal plane array having a plurality of mesas forming a plurality of pixels.

41. The method of claim 31 comprising:
etching through the second absorber to form a mesa;
wherein the mesa forms one pixel of a focal plane array having a plurality of mesas forming a plurality of pixels.

42. The method of claim 31 wherein:
the second absorber is a ternary alloy comprising of substantially of InAsSb or a quaternary alloy comprising of AlInAsSb; and
the first absorber is a quaternary alloy comprising of AlInAsSb, a quaternary alloy of GaInAsSb, a ternary alloy of consisting substantially of GaInSb, or a ternary alloy consisting substantially of AlInSb, or a binary alloy InAs.

43. The method of claim 31 wherein:
the second absorber is a medium wavelength infrared detector (MWIR) detector; and
the first absorber is a MWIR detector or a short wavelength infrared detector (SWIR) detector.

44. The method of claim 31 wherein:
when a positive bias is applied to the second absorber, the second infrared wavelengths generates electrons in the second absorber that are collected at a read out integrated circuit; and
when a negative bias is applied to the second absorber, the first infrared wavelengths generates electrons in the first absorber that are collected at the read out integrated circuit.

45. The method of claim 31 wherein:
when a positive bias is applied to the second absorber, the first infrared wavelengths generate electrons in the first absorber that are collected at a read out integrated circuit; and when a negative bias is applied to the second absorber, the second infrared wavelengths generate holes in the second absorber that are collected at the read out integrated circuit.

46. The method of claim 31 wherein:

the dual band detector operates at temperatures equal to or greater than 100K.

47. The method of claim 31 comprising:

tuning a $\lambda_{co}$ for the dual band detector over a medium wavelength infrared spectrum by adjusting mole fractions for the first absorber and or the second absorber.

* * * * *